United States Patent [19]

Sprague et al.

[11] Patent Number: 4,967,196
[45] Date of Patent: * Oct. 30, 1990

[54] APPARATUS FOR DECODING VARIABLE-LENGTH ENCODED DATA

[75] Inventors: David L. Sprague, Hopewell; Allen H. Simon, Belle Mead, both of N.J.

[73] Assignee: Intel Corporation, Santa Clara, Calif.

[*] Notice: The portion of the term of this patent subsequent to Apr. 18, 2006 has been disclaimed.

[21] Appl. No.: 175,993

[22] Filed: Mar. 31, 1988

[51] Int. Cl.$^5$ .............................................. H03M 7/42
[52] U.S. Cl. ........................................ 341/67; 341/107
[58] Field of Search .................... 341/50, 65, 67, 76, 341/79, 106, 107; 358/135, 138, 160, 133

[56] References Cited

U.S. PATENT DOCUMENTS

| | | | |
|---|---|---|---|
| 3,883,847 | 5/1975 | Frank | 340/146.1 R |
| 4,125,861 | 11/1978 | Mounts et al. | 358/133 |
| 4,369,463 | 1/1983 | Anastassiou | 358/135 |
| 4,386,416 | 5/1983 | Giltner | 364/900 |
| 4,396,906 | 4/1983 | Weaver | 340/347 |
| 4,574,382 | 3/1986 | Ko | 375/25 |
| 4,580,162 | 4/1986 | Mori | 358/135 |
| 4,593,267 | 6/1986 | Kuroda et al. | 340/347 |
| 4,823,201 | 4/1989 | Simon et al. | 358/133 |

FOREIGN PATENT DOCUMENTS 2514969 4/1983 France.

OTHER PUBLICATIONS

Abramson, N. Information Theory and Coding, McGraw Hill, 1963, pp. 77-92.

Primary Examiner—William M. Shoop, Jr.
Assistant Examiner—Brian K. Young
Attorney, Agent, or Firm—Carl L. Silverman; William H. Murray; Frank M. Linguiti

[57] ABSTRACT

Digital image data is encoded using a variable-length code which is described by a group of parameter values. Each parameter value describes a set of code values; each code value corresponds to a possible value of the data which is to be encoded. When the data is encoded, the parameter values are appended to the encoded data. A decoder stores the parameter values into a memory and then combines data values derived from the encoded data with parameter values from the memory to generate decoded data values. Each code word includes a prefix which indicates a number of successive parameter values which are to be summed, and a population index which is to be added to the summed parameter values to produce a decoded data value.

6 Claims, 9 Drawing Sheets

FIG. 2
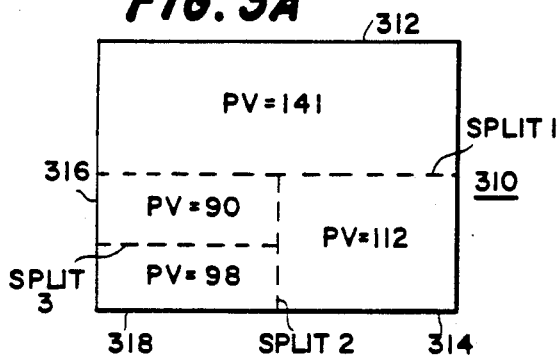
PIXEL VALUES FROM SOURCE 10
141, 141, 141, 141, 141, 141, 141, 141, 90, 90,
112, 112, 98, 98, 112, 112
DPCM COMPRESSED DATA
127, 14, 0, 0, 0, 0, 0, 0, -51, 0,
22, 0, -14, 0, 14, 0
FIG. 3A
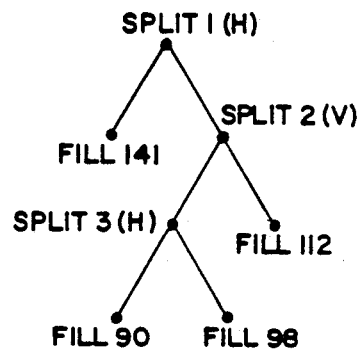
FIG. 3B
SPLIT 1 (H)
FILL 141
SPLIT 2 (V)
SPLIT 3 (H)
FILL 112
FILL 90
FILL 98
FIG. 3C
BINARY SPLIT AND FILL COMPRESSED DATA
|   | TYPE | VALUE | LEFT | RIGHT |
|---|------|-------|------|-------|
| 0 | 1    | 0     | 1    | 2     |
| 1 | 0    | 141   | 0    | 0     |
| 2 | -1   | 0     | 3    | 6     |
| 3 | 1    | 0     | 4    | 5     |
| 4 | 0    | 90    | 0    | 0     |
| 5 | 0    | 98    | 0    | 0     |
| 6 | 0    | 112   | 0    | 0     |
| 7 | 2    | 0     | 0    | 0     |

```
BEGIN                                                                10
  % PROGRAM TO TRANSFORM BINARY SPLIT FILL DATA INTO A FORM SUITABLE FOR  20
  % ENCODING BY A STATISTICAL ENCODER                                30
  ARRAY TREE [0:1023,0:3];   % BINARY SPLIT FILL DATA               40
  DEFINE TYPE = 0%,          % NODE OR TYPE OF SPLIT                50
         VALUE = 1%,         % VALUE OF NODE OR BRANCH              60
         LEFT = 2%,          % POINTER INTO TREE FOR LEFT BRANCH    70
         RIGHT = 3%;         % POINTER INTO TREE FOR RIGHT BRANCH   80
  ARRAY OUT [0:2047];        % TRANSFORMED DATA                     90
  INTEGER ZERO_AVG,I%,O%;                                          100
  FILE COMP_PROCESSOR;       % COMPRESSION PROCESSOR               110
  FILE STAT_ENCODER;         % STATISTICAL ENCODER                 120
                                                                   130
  INTEGER PROCEDURE BRANCH_AVG (INDEX);   % CALCULATES THE AVERAGE VALUE AT  140
  VALUE INDEX;                            % EACH BRANCH OF THE BINARY TREE  150
  INTEGER INDEX;                                                   160
    BEGIN                                                          170
      INTEGER RV,LV,RI,LI;  % RIGHT AND LEFT VALUES, RIGHT AND LEFT INDEXES  180
      RI:= TREE [INDEX,RIGHT];                                     190
      LI:= TREE [INDEX,LEFT];                                      200
      IF TREE [RI,TYPE] = 0 THEN % FILL NODE                       210
        RV:= TREE [RI,VALUE]                                       220
      ELSE                     % SPLIT NODE                        230
        RV:= BRANCH_AVG (RI);                                      240
      IF TREE [LI,TYPE] = 0 THEN % FILL NODE                       250
        LV:= TREE [LI,VALUE]                                       260
      ELSE                     % SPLIT NODE                        270
        LV:= BRANCH_AVG (LI);                                      280
      BRANCH_AVG:= TREE [INDEX,VALUE]:= (RV + LV) / 2;             290
    END;                                                           300
                                                                   310
  PROCEDURE R_MINUS_L (INDEX);   % PROCEDURE TO CALCULATE DIFFERENCE  320
  VALUE INDEX;                   % BETWEEN VALUES OF RIGHT AND LEFT NODES  330
  INTEGER INDEX;                                                   340
    BEGIN                                                          350
      INTEGER RV,LV,RI,LI;  % RIGHT AND LEFT VALUES, RIGHT AND LEFT INDEXES  360
      RI:= TREE [INDEX,RIGHT];                                     370
      LI:= TREE [INDEX,LEFT];                                      380
      RV:= TREE [RI,VALUE];                                        390
      LV:= TREE [LI,VALUE];                                        400
      TREE [INDEX,VALUE]:= RV - LV;                                410
      IF TREE [RI,TYPE] <> 0 THEN % SPLIT NODE                     390
        R_MINUS_L (RI);                                            440
      IF TREE [LI,TYPE] <> 0 THEN % SPLIT NODE                     460
        R_MINUS_L (LI);                                            510
    END;                                                           540
```

*FIG. 4A*

```
INTEGER PROCEDURE SIGN_XFORM (ARG);        550
VALUE ARG;                                  560
INTEGER ARG;                                570
    IF ARG < 0                              580
        SIGN_XFORM:= ABS(ARG) * 2 - 1       590
    ELSE                                    600
        SIGN_XFORM:= ARG * 2;               610
                                            620
                                            630
% GET BINARY FILL DATA FROM COMPRESSION PROCESSOR  640
                                            650
READ(COMP_PROCESSOR,TREE [*,*]);            660
                                            670
% CALCULATE BRANCH AVERAGES                 680
                                            690
BRANCH_AVG (0);                             700
ZERO_AVG:= 128 - TREE [0,VALUE];            710
                                            720
% CALCULATE RIGHT MINUS LEFT DIFFERENCE VALUES  730
                                            740
R_MINUS_L (0);                              750
                                            760
% BUILD ARRAY TO PASS TO STATISTICAL ENCODER  770
                                            780
                                            790
IX:= 0;                                     800
OX:= 1;                                     810
OUT [0]:= SIGN_XFORM (ZERO_VALUE);          820
WHILE TREE [IX,TYPE] < 2 DO                 830
    BEGIN                                   840
        OUT [OX]:= SIGN_XFORM (TREE [IX,TYPE]);  850
        OX:= OX + 1;                        860
        IF TREE [IX,TYPE] <> 0 THEN         870
            BEGIN                           880
                OUT [OX]:= SIGN_XFORM (TREE [IX,VALUE]);  890
                OX:= OX + 1;                900
            END;                            910
        IX:= IX + 1;                        920
    END;                                    925
OUT [OX]:= -1;                              930
WRITE (STAT_ENCODER,OUT[*]);                940
END.
```

FIG.4B

DPCM DATA AFTER SIGN TRANSFORMATION
254, 28, 0, 0, 0, 0, 0, 0, 101, 0, 44, 0, 27, 0, 28, 0   *FIG. 5A*

BINARY SPLIT AND FILL DATA
RELATIVE TRANSFORMATION

BINARY SPLIT AND FILL DATA AFTER
DATA RELATIVE TRANSFORMATION   *FIG. 5C*

| | TYPE | VALUE | LEFT | RIGHT |
|---|---|---|---|---|
| 0 | 1 | -38 | 1 | 2 |
| 1 | 0 | 0 | 0 | 0 |
| 2 | -1 | 18 | 3 | 6 |
| 3 | 1 | 8 | 4 | 5 |
| 4 | 0 | 0 | 0 | 0 |
| 5 | 0 | 0 | 0 | 0 |
| 6 | 0 | 0 | 0 | 0 |
| 7 | 2 | 0 | 0 | 0 |

ZERO-AVG = 6

BINARY SPLIT AND FILL DATA AFTER SIGN TRANSFORMATION;
PACKED FOR TRANSMISSION TO STATISTICAL ENCODER
(PARAMETERS 'LEFT' AND 'RIGHT' ARE NOT ENCODED)

12, 2, 77, 0, 1, 36, 2, 16, 0, 0, 0   *FIG. 5D*

```
BEGIN                                                                    1000
  ARRAY STAT [0:255], IN [0:2047], TABLE[0:15];                          1010
  FILE COMP_PROCESSOR;                                                   1015
  FILE XMIT_CHANNEL;                                                     1020
  STRING BASE, DATA_OUT;                                                 1025
  STRING ARRAY XLATE_TABLE [0:255];                                      1030
  INTEGER I, J, K, N, TOTAL_COUNT, STAT_SUM, LEVEL;                      1035
  REAL PROB;                                                             1040
                                                                         1045
  % GET DATA FROM COMPRESSION PROCESSOR                                  1050
                                                                         1060
  READ(COMP_PROCESSOR, IN [*]);                                          1070
                                                                         1080
  % DETERMINE STATISTICAL DISTRIBUTION OF DATA                           1090
                                                                         1100
  I:= 0;                                                                 1110
  WHILE IN [I] >= 0 DO                                                   1120
    BEGIN                                                                1130
      STAT [IN [I]]:= STAT [IN [I]] + 1;                                 1140
      I:= I + 1;                                                         1150
    END;                                                                 1160
  TOTAL_COUNT:= I;                                                       1170
                                                                         1180
  % DEVELOP STATISTICAL CODE                                             1190
                                                                         1200
  I:= LEVEL:= 0;                                                         1210
  WHILE I < 256 DO                                                       1220
    BEGIN                                                                1230
      PROB:= STAT [I] / TOTAL_COUNT;                                     1240
      IF PROB = 0 THEN                                                   1243
        N:= 7                                                            1246
      ELSE                                                               1248
        N:= INT(-LOG2(PROB)) - 1;                                        1250
      IF N < 0 THEN                                                      1255
        N:= 0                                                            1260
      ELSE IF N > 7 THEN                                                 1261
        N:= 7;                                                           1263
      STAT_SUM:= 0;                                                      1265
      FOR J:= 0 TO (2 ** N) - 1 DO                                       1270
        IF I+J < 256 THEN                                                1275
          STAT_SUM:= STAT_SUM + STAT [I+J];                              1280
      IF STAT_SUM / TOTAL_COUNT < 0.3820 THEN                            1290
        BEGIN                                                            1300
          FOR J:= 2 ** N TO (2 ** (N + 1)) - 1 DO                        1306
            IF I+J < 256 THEN                                            1308
              STAT_SUM:= STAT_SUM + STAT [I+J];                          1310
          N:= N+1;                                                       1313
        END;                                                             1316
      IF I + (2 ** (N + 1)) > 255 THEN                                   1320
        BEGIN % LAST PARAMETER, DOUBLE POPULATION                        1323
          TABLE [LEVEL]:= N + 1;                                         1326
          I:= 256;                                                       1330
        END                                                              1333
      ELSE                                                               1336
        BEGIN                                                            1340
          TABLE [LEVEL]:= N;                                             1343
          I:= I + (2 ** N);                                              1346
          LEVEL:= LEVEL + 1;                                             1350
        END;                                                             1353
      TOTAL_COUNT:= TOTAL_COUNT - STAT_SUM;                              1370
    END;                                                                 1380
```

FIG. 6A

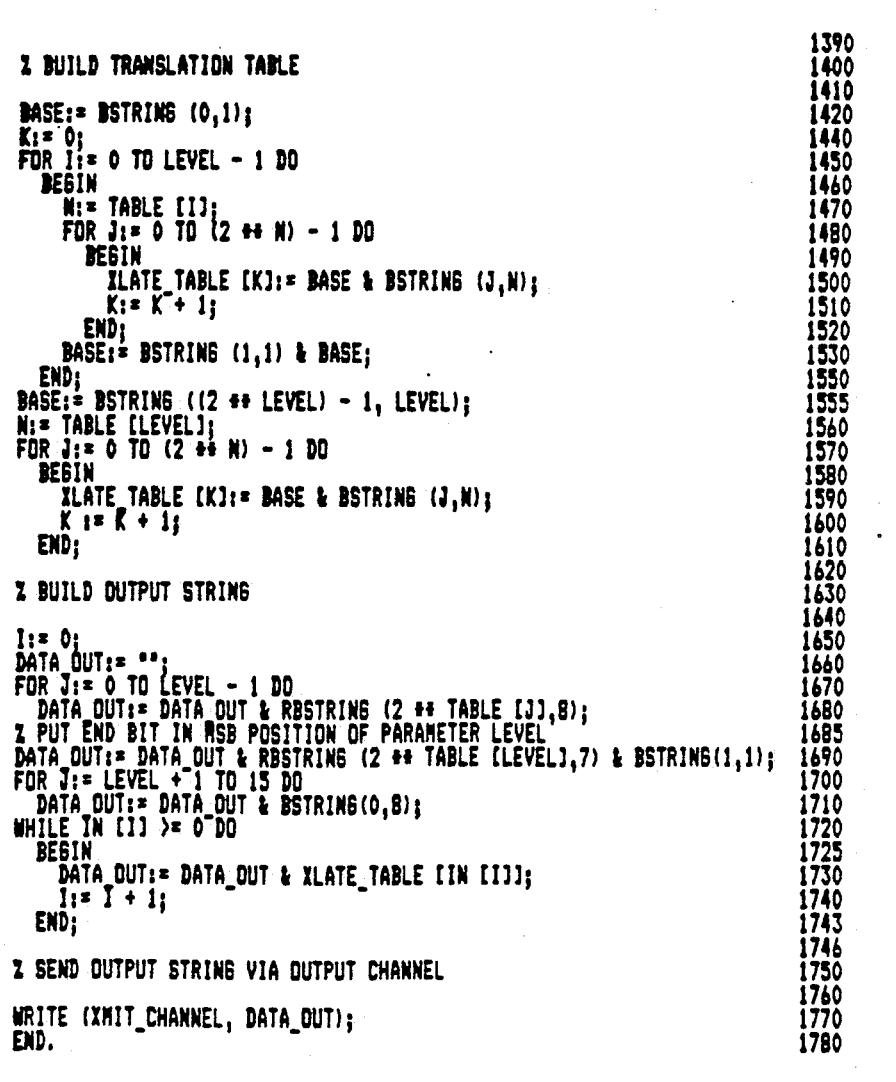

```
% BUILD TRANSLATION TABLE                                        1390
                                                                 1400
                                                                 1410
BASE:= BSTRING (0,1);                                            1420
K:= 0;                                                           1440
FOR I:= 0 TO LEVEL - 1 DO                                        1450
  BEGIN                                                          1460
    N:= TABLE [I];                                               1470
    FOR J:= 0 TO (2 ** N) - 1 DO                                 1480
      BEGIN                                                      1490
        XLATE_TABLE [K]:= BASE & BSTRING (J,N);                  1500
        K:= K + 1;                                               1510
      END;                                                       1520
    BASE:= BSTRING (1,1) & BASE;                                 1530
  END;                                                           1550
BASE:= BSTRING ((2 ** LEVEL) - 1, LEVEL);                        1555
N:= TABLE [LEVEL];                                               1560
FOR J:= 0 TO (2 ** N) - 1 DO                                     1570
  BEGIN                                                          1580
    XLATE_TABLE [K]:= BASE & BSTRING (J,N);                      1590
    K := K + 1;                                                  1600
  END;                                                           1610
                                                                 1620
% BUILD OUTPUT STRING                                            1630
                                                                 1640
I:= 0;                                                           1650
DATA_OUT:= "";                                                   1660
FOR J:= 0 TO LEVEL - 1 DO                                        1670
  DATA_OUT:= DATA_OUT & RBSTRING (2 ** TABLE [J],8);             1680
% PUT END BIT IN MSB POSITION OF PARAMETER LEVEL                 1685
DATA_OUT:= DATA_OUT & RBSTRING (2 ** TABLE [LEVEL],7) & BSTRING(1,1);  1690
FOR J:= LEVEL + 1 TO 15 DO                                       1700
  DATA_OUT:= DATA_OUT & BSTRING(0,8);                            1710
WHILE IN [I] >= 0 DO                                             1720
  BEGIN                                                          1725
    DATA_OUT:= DATA_OUT & XLATE_TABLE [IN [I]];                  1730
    I:= I + 1;                                                   1740
  END;                                                           1743
                                                                 1746
% SEND OUTPUT STRING VIA OUTPUT CHANNEL                          1750
                                                                 1760
WRITE (XMIT_CHANNEL, DATA_OUT);                                  1770
END.                                                             1780
```

*FIG. 6B*

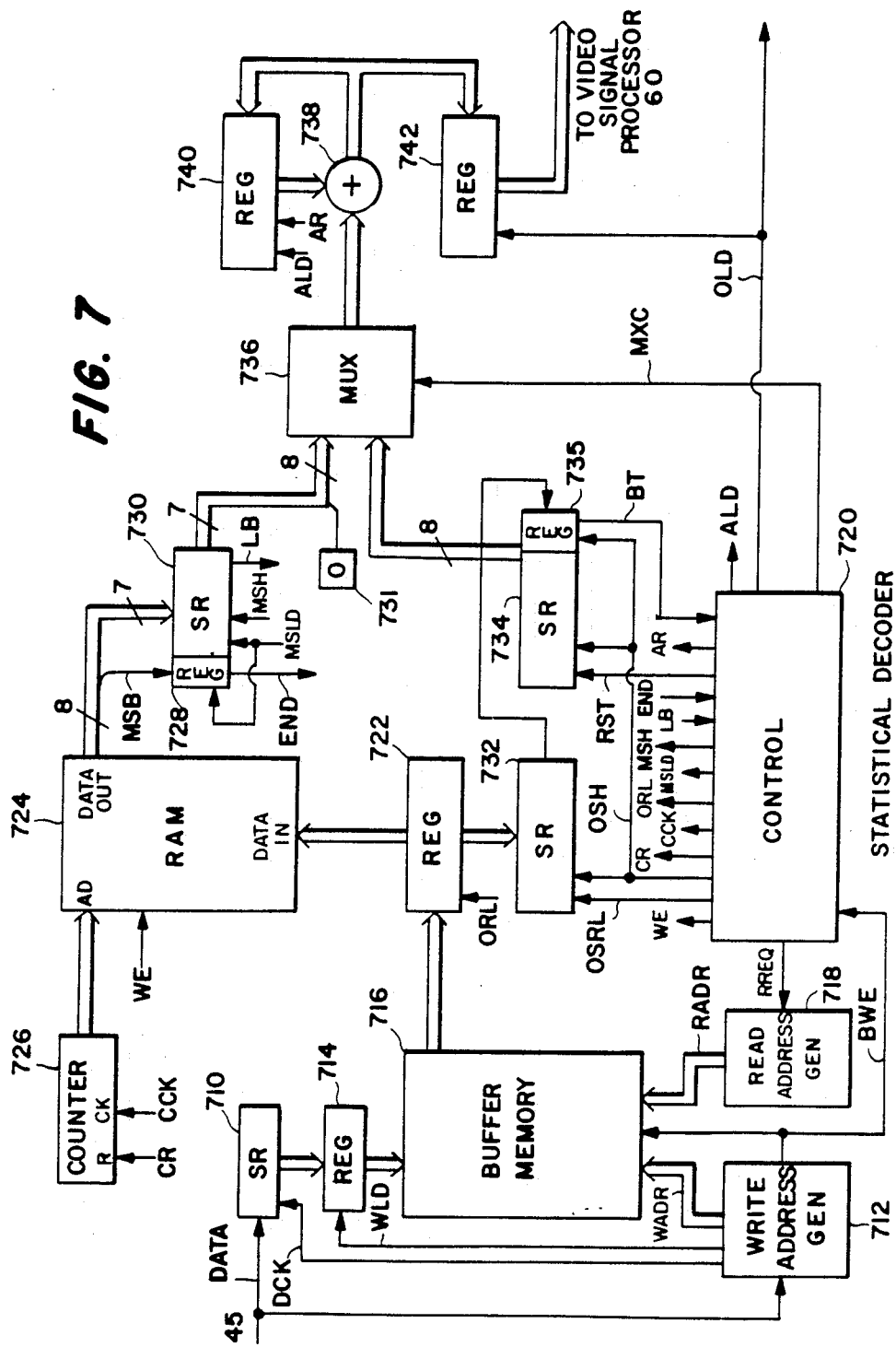

APPARATUS FOR DECODING VARIABLE-LENGTH ENCODED DATA

The present invention relates to circuitry for decoding variable-length encoded data where the variable-length code is defined by parameters passed with the data.

Recent advances in the field of digital data processing have generated a demand for systems which can transfer and process relatively large amounts of digital data. It is also desirable, however, that this data be compressed so that it may be efficiently transmitted via, for example, a standard telephone line or efficiently stored in a relatively small memory.

An example of a digital data processing system where it is desirable to transfer and process a relatively large volume of data is a video signal processing system. For example, a system which produces an image composed of 240 lines, each line containing 256 eight-bit pixel values, needs 61,440 bytes for each image frame. Assuming a display rate of 30 frames per second, this system has a data rate of 1,843,200 bytes per second.

It is well known that the number of bytes per frame in a video signal processing system may be reduced by encoding the data. A system for encoding video data is described, for example in U.S. Pat. No. 4,125,861 entitled "Video Signal Encoding", which is hereby incorporated by reference. In the system described in this reference, the video data are first compressed using a differential pulse code modulation (DPCM) technique and then encoded using a variable length code in which the statistically more frequently occurring data values are assigned to the shorter code words and less frequently occurring data values are assigned to the longer code words. As used in this application, this type of encoding is referred to as statistical encoding.

One method of statistically encoding data is to use an optimal variable-length code such as a Huffman code. To use this code, the data to be transmitted is ordered from the most frequently occurring to the least frequently occurring and a Huffman code is generated using, for example, the algorithm described at pages 77-85 of a book entitled *Information Theory And Coding* by N. Abramson, McGraw Hill, 1963, which is hereby incorporated by reference. Using this method, a table which gives the correspondence between the data values and the code values is transmitted along with the encoded data to allow the system which decodes the data to translate the code words into their corresponding data values. The extra overhead of having to transmit or store the translation table with the encoded data renders this encoding technique impractical when only a relatively small amount of data is to be transmitted or stored.

A second method for statistically encoding data is to process the data according to a predetermined algorithm to obtain data having a statistical distribution of values which generally approximates a known distribution. The data is then encoded, using a code which has been tailored for the known distribution, transmitted and then decoded using a fixed table which is the inverse of the table used to encode the data.

The above-referenced U.S. Pat. No. 4,125,861 relates to a system of this type. The DPCM processing performed by the system described in that patent produces data having a value distribution that has a peak at zero and that is roughly exponential in form on either side of the peak. This data is then statistically encoded using a preset table stored in a read only memory (ROM). The data is then transmitted to a receiver which may decode the data using the inverse table, also stored in ROM.

A system of the type described above has advantages in that it significantly compresses the input data and does not require that a translation table be transmitted with the compressed data. However, this type of system also has disadvantages since the level of compression achieved may not be as desirable as that which would have been achieved if a more tailored statistical encoding scheme had been used.

It would be advantageous if a data encoding and decoding system could be devised that produced an efficient encoding of data which exhibits a variety of statistical patterns and which does not need to provide an extensive translation table with the encoded data.

SUMMARY OF THE INVENTION

The present invention is embodied in circuitry for decoding statistically encoded data which includes a plurality of parameter values that describe the statistical code. The circuitry includes a memory for holding the parameter values and circuitry, responsive to the encoded data for selectively combining the parameter values with values extracted from the encoded data to generate decoded data.

BRIEF DESCRIPTION OF THE DRAWINGS

FIGS. 2, 3A, 3B and 3C are lists of values and diagrams that are useful for explaining the operation of the video signal compressor 20 shown in FIG. 1.

FIGS. 4A and 4B are a computer program listing, in the ALGOL 60 computer programming language, that are useful for explaining the operation of the compressed video signal processor 30 shown in FIG. 1.

FIGS. 5A, 5B, 5C and 5D are lists of values and diagrams that are useful for explaining the operation of the compressed signal processor 30 shown in FIG. 1.

FIGS. 6A and 6B are a computer program listing, in the ALGOL 60 computer programming language that is useful for explaining the operation of the statistical encoder 40 shown in FIG. 1.

FIG. 7 is a block diagram showing circuitry suitable for use as the statistical decoder 50 shown in FIG. 1.

DETAILED DESCRIPTION

Figure 1:
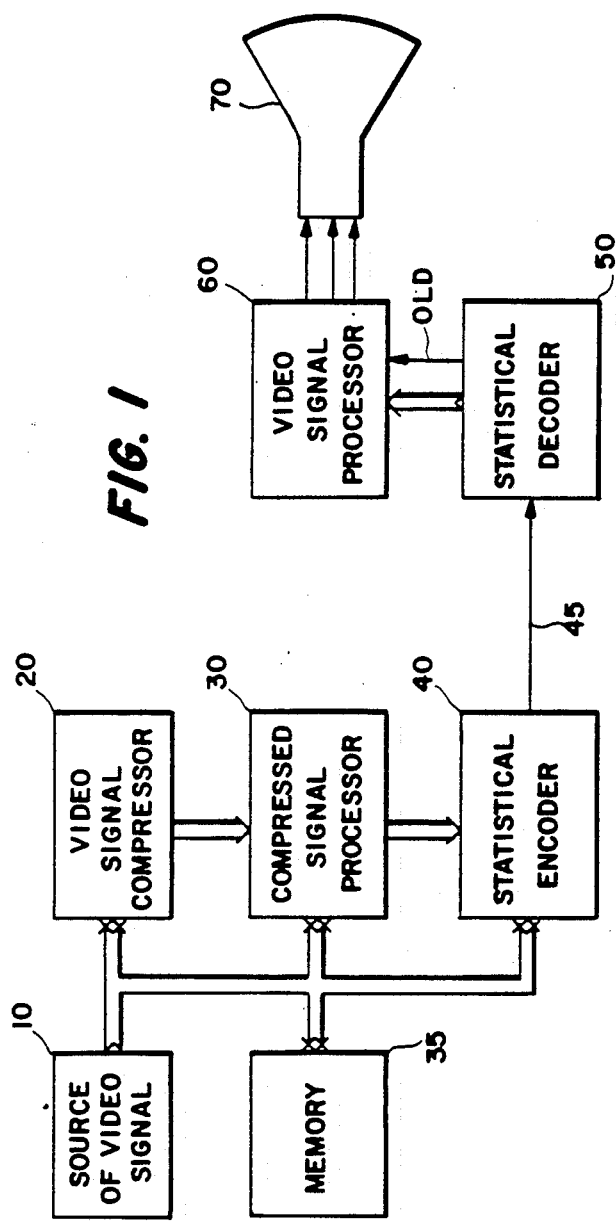
FIG. 1 is a block diagram of a video signal processing system which incorporates the present invention.

The description set forth below is in the context of a digital video signal processing system. It is contemplated, however, that the general techniques described herein may be applied to types of data other then video signals.

In the drawings, broad arrows represent busses for conveying multiple-bit parallel digital signals and line arrows represent connections for conveying analog signals or single-bit digital signals. Depending on the processing speed of the devices, compensating delays may be required in certain of the signal paths. One skilled in the art of digital signal processing circuit design will know where such delays are needed in a particular system.

FIG. 1 is a block diagram of a video signal processing system which includes an embodiment of the present invention. In FIG. 1, a source of video signal 10 which is, for example, a video camera, provides a digitized video signal to a video signal compressor 20. The compressor 20 may process the video data applied to it using any of a number of video compression techniques. Two techniques are described below; a differential pulse code modulation (DPCM) algorithm, and a binary tree split and fill algorithm. The compressed video signals provided by the compressor 20 are applied to a processor 30 which transforms the compressed data into a form especially suited for encoding by a statistical encoder 40.

The statistical encoder 40 processes the transformed data to develop an efficient code for the data and then encodes it. The encoded transformed data is transmitted to a statistical decoder 50 via the transmission line 45. The transmission line 45 may be, for example a bit-serial connection between the encoder 40 and decoder 50.

The data transmitted to the statistical decoder 50 by the statistical encoder 40 includes a set of parameters which define the particular code that was used to encode the data. These parameters are used by the decoder 50, as set forth below, to decode the data. The decoded data developed by the statistical decoder 50 is applied to a video signal processor 60 where it is converted into signals which, when applied to the display device 70, reproduce an image represented by the signals originally provided by the source 10.

The overview presented above provides a context of a more detailed description of the system shown in FIG. 1. In FIG. 1, the video signal compressor 20, the compressed signal processor 30 and the statistical encoder 40 may be realized as separate programmed microprocessors which share a common data memory 35 or as a single microprocessor which uses the memory 35 to hold data and to hold the programs which change the microprocessor into each one of the processors 20, 30 and 40, in sequence, to produce an encoded video signal.

FIG. 2 is an example of the DPCM encoding of a series of input pixel values by the compressor 20 shown in FIG. 1. The DPCM encoding technique that is used in this embodiment of the invention is the same as the basic technique used in the above referenced U.S. Pat. No. 4,125,861. Briefly, each code value is the difference between the supplied pixel value and the accumulated sum of all previous code values. In FIG. 2, 16 pixel values from source 10 generate an exemplary four-by-four image 210. These pixel values are encoded using the method described above to generate DPCM compressed data shown in FIG. 2.

To allow the image to be represented as a sequence of eight-bit binary values, the maximum value for a DPCM sample in the present example is +127 and the minimum value is −128. The effect of this limitation is shown in the first two sample values of the DPCM compressed data. The first pixel value is limited to 127 and the second pixel value is an increment which, when added to 127 produces the pixel value 141. Although the algorithms used in this embodiment of the invention assume eight-bit pixel values, it is contemplated that a larger or smaller number of bits may be used to represent a pixel value.

By analyzing the DPCM encoded data produced from many video images, the inventors have determined that DPCM encoded video data generally conforms to a Laplacian statistical distribution. This type of distribution has a peak at zero and a statistical distribution of values greater than and less then zero which each approximate a negative exponential function of the magnitude of the value.

FIGS. 3A, 3B, and 3C provide an overview of the encoding process called binary split and fill. The algorithm generally described below is performed by the video signal compressor 20. As a first step, the pixel data which decribes a single video frame is stored by the processor 20 into the memory 35. This data is organized for example as a rectangular matrix having 4 rows and 4 columns. This image matrix is represented by the rectangle 310 of FIG. 3A.

In this simplified example, the video image 310 is the same as the image 210 described above. This image consists of four regions (312, 314, 316, and 318) in which the pixels are assumed to have uniform gray levels (eg. 141, 112, 90, and 98, respectively, out of a possible range of 256 gray levels). The pixel value distribution of this image is atypical. It is intended to illustrate a simple binary tree decomposition of an image, where each of the decomposed region is assigned a fill value, and how this decomposition may be efficiently encoded. In the more general case, the "fill" (i.e. the code representing the region pixel values) may be a polynomial expression such as $Ax+By+C$. In this expression, the coefficient "A" represents the slope or brightness gradient in the horizontal (x) direction, "B" represents the gradient in the vertical (Y) direction and "C" represents a constant or uniform brightness over the region. In the example of FIG. 3A, the coefficients A and B of the fill polynomial $AX+BY+C$ are both zero.

Binary tree decomposition is performed by splitting a region in half, and then possibly splitting each of the resulting sub-regions in half until fill values can be found which adequately represent the resulting sub-regions.

In the present example, the first split, labeled SPLIT 1 in FIG. 3A, splits the image 310 horizontally into two equal halves. The top half, 312, can be adequately encoded by the single value 141 while the bottom half needs further decomposition. A vertical split, SPLIT 2, divides the bottom half of the image into two equal regions. The right half, 314, can be adequately encoded by the value 112 and is not split any further. In the left half, however, another horizontal split, SPLIT 3, is desired to obtain two regions 316 and 318 which can be adequately represented by the values 90 and 98, respectively.

FIGS. 3B and 3C illustrate the digital encoding of the binary split and fill representation of the image shown in FIG. 3A. The inverted tree-like structure shown in FIG. 3B represents successive divisions of the image 310. This structure is referred to as a "binary tree" because each node which is not a terminal node splits to form two subbranches. The top node of the tree represents the entire image 310. Each time a region is split, two new nodes are formed. The terminal nodes of the tree (i.e. those having no branches) are encoded with the region fill values.

FIG. 3C represents an array of data values which describe the tree structure shown in FIG. 3B. The array consists of eight rows, corresponding to the seven nodes of the binary tree and a node which contains a stop type value. Each row includes four parameters (columns) which describe the node. The first parameter, TYPE, describes the node as a horizontal split (1), vertical split (−1), fill (0) or stop (2) node. The stop node has no correspondence to the image. It is provided as an indicator to the programs which use the array that the last node has been processed. The second parameter, VALUE, holds the value of the node for all fill nodes, and a zero for the split nodes. The last two parameters, LEFT and RIGHT, are pointers to the entries in the array which describe the left and right nodes, respectively, that are associated with a horizontal or vertical split operation. The parameters LEFT and RIGHT are zero valued for fill nodes. The values of the parameters LEFT and RIGHT correspond to the column of numbers at the far left of FIG. 3C.

Since a binary tree is used to describe the image, the parameters LEFT and RIGHT are not needed for any of the nodes. They are included in the present example to simplify the explanation of the operations performed by the compressed signal processor 30. The binary tree may be built and traversed using a set of rules which unambiguously defines the position of any node relative to all other nodes without using the parameters LEFT and RIGHT. In the present example, the rule is to place all data corresponding to the upper or left region generated by a horizontal or vertical split, respectively, immediately after the data which describes the split and then to enter the data describing the lower or right region generated by the split. This is an inherently recursive procedure that begins with the top or root node of the tree and operates on all successive nodes in fixed order until all terminal nodes are reached. Since they are not needed to describe the tree structure, the parameters LEFT and RIGHT are not encoded by the encoder 40.

As set forth above, the processor 30 converts either DPCM data or binary split and fill data into a form suitable for encoding by the statistical encoder 40. As described below in reference to FIG. 6, the statistical encoder uses a set of codes which implement an efficient encoding when the statistical distribution of the values to be encoded may be approximated by a piecewise negative exponential distribution. The DPCM encoded video data generally exhibits a statistical distribution that approximates a Laplacian distribution, which is a two-sided negative exponential distribution. To transform this data into a form suitable for encoding by the statistical encoder 40, the compressed signal processor 30 maps the negative numbers into interstitial locations between the positive numbers. This transformation is accomplished by doubling the value of all positive numbers and by changing the polarity for negative numbers, doubling the changed values and subtracting one from the result. This algorithm is described in the procedure SIGN_XFORM of FIG. 4B. FIG. 5A is an example of DPCM data which has been subject to the sign transformation operation. This data is a transformed version of the compressed data described in reference to FIG. 2.

The transformation of the binary split and fill data into a form suitable for use by the statistical encoder 40 is a more complicated process. FIGS. 4A and 4B are a computer program in the ALGOL 60 computer language which transforms binary split and fill data in the form shown, for example, in FIG. 3C, into a sequence of values such as those shown in FIG. 5D.

The computer program shown in FIGS. 4A and 4B is described with reference to the line numbers in the right margin of the FIGURES. Each of the array elements and integer variables used in the programs shown in FIGURES 4A, 4B, 6A and 6B is assumed to hold at least nine-bits of data and so, may represent data values between +255 and −256. The array TREE, which is declared at line 40, contains the binary split and fill description of an image. The number of elements in the array TREE and in the other arrays used in the computer programs shown in FIGS. 4A, 4B, 6A and 6B are exemplary. Larger numbers of values may be required to process general video data.

An example of the array TREE is shown in FIGURE 3C. The data in this array may describe 1024 nodes, each of which includes four parameters. Mnemonic names for the values used to access the various parameters are defined at lines 50–80. The parameter TYPE indicates the type of node, 1, −1, 0 or 2 for horizontal split, vertical split, fill, and stop respectively. The VALUE parameter is the value associated with the node. The parameters LEFT and RIGHT are indexes into the array TREE which point to the two nodes that are generated by either a horizontal or vertical split operation. These indexes correspond to the left-most column of numbers in FIG. 3C.

The array OUT, declared at line 90 is the compact, transformed version of the binary split and fill data that is developed by the programs.

To simplify the description of the transformation algorithm, the video signal compressor 20 and the statistical encoder 40 are modeled as an input file and an output file, respectively. These files are declared at lines 110 and 120.

The procedure BRANCH_AVG, declared at lines 140 to 300, steps through the tree from the root node down through every split node and every fill node using a recursive algorithm. For each split node in the tree, the procedure calculates the average of the VALUE parameters of the right and left branch nodes and assigns the average value to the VALUE parameter of the split node.

The procedure R_MINUS_L declared at lines 320 to 540 steps through the tree recursively using the same algorithm as used by the procedure BRANCH_AVG and, for each split node, it calculates the difference between the VALUE parameters of the right and left branch nodes and stores result as the VALUE parameter of the split node.

The procedure SIGN_XFORM, which is declared at lines 550 to 620, performs the sign transformation operation described above. It doubles the value of all positive values passed to it and changes the sign of negative values, doubles the sign-changed value and subtracts one from the result.

The program which generates the compact transformed version of the binary tree has its first executable statement at line 660. This statement gets an array TREE from the video signal compression processor 20. As set forth above, this array is in the same form as the array shown in FIG. 3C.

Figure 5B:
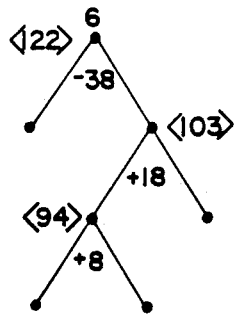

The next step in the program, at line 700, invokes the procedure BRANCH-AVG for the root node (index zero of the array TREE). This invocation traces through the entire binary tree, and, working from the terminal nodes up to the root node, places the average of the VALUE parameters for the left and right branch nodes of each split node into the VALUE parameter of the split node. This transformation is illustrated in FIG. 5B, where the values in the angle brackets ("<" and ">") are the branch node average values that are placed in the VALUE parameter of each split node.

After computing the branch average values, the program, at line number 710, subtracts the branch average value for the root node from 128 and saves the result in a variable ZERO_AVG. The next step in the program, at line 750, invokes the procedure R_MINUS_L to calculate the difference between the VALUE parameters for the right and left branch nodes of each split node. These difference values are stored in the VALUE parameter of each of the split nodes.

The final portion of the program, from line 790 to 930, converts the data in the array TREE into a serial stream of values, such as that shown in FIG. 5D, which describes the binary split and fill data. In this portion of the program, the fill value for the root node (i.e. ZERO_VALUE) is placed into the array OUT at index zero. Next, each of the nodes in the array TREE is processed in sequence. The TYPE parameter for each node is appended to the array OUT and, if the node is not a terminal node, the FILL value is also appended; terminal nodes are assumed to have fill values of zero. The parameters LEFT and RIGHT are not included in the serial stream of values. Each of the values appended to the array OUT is subject to sign transformation.

The statement at line 925 marks the end of valid data in the array OUT by inserting a negative stop value. When all of the nodes have been appended to the array OUT, the statement 930 causes the data in the array OUT to be transferred to the statistical encoder 40.

The inventors have determined that the operations described above generate data describing a binary split and fill decomposition of a video image which data, in general statistically conforms to a piecewise negative exponential distribution.

The data transformation algorithms used to produce the transformed DPCM and binary split and fill data may be readily reversed, after the data is decoded, to obtain the original data.

The program listing shown in FIGS. 6A and 6B illustrates the operation of the statistical encoder 40 as it develops a variable length code for a set of data values and as it encodes the data values for transmission. The array IN, declared at line 1010, corresponds to the array OUT used in the program shown in FIGS. 4A and 4B. This array holds up to 2048 data values provided by the compressed signal processor 30. The array STAT also declared at line 1010 holds values representing a histogram of the various data values in the array IN. The file COMP_PROCESSOR, declared at line 1015, is the channel to the compressed signal processor 30 and the file XMIT_CHANNEL, declared at line 1020, is the transmission channel 45 to the statistical decoder 50.

The string variable DATA_OUT declared at line 1025 is a binary string which holds the encoded data to be sent to the statistical decoder 50 via the transmission channel 45. The string array XLATE_TABLE, declared at line 1030 is a translation table which holds the variable-length code words corresponding to the fixed-length data words in the array IN. The other declared variables are temporary storage used in the program as set forth below.

The first executable statement in the program for the statistical encoder 40 is at line 1070. This statement receives the data provided by the compressed signal processor 30; it corresponds to the statement at line 930 of FIG. 4B. The data received from the compressed signal processor 30 is stored into the array IN.

The statements at lines 1110 to 1170 develop values representing a histogram of the various data values in the array IN. The algorithm represented by these statements assumes that the 256 values in the array STAT—one for each possible eight-bit pixel value—are initially zero. In the WHILE, loop which spans statements 1120 to 1160, each valid entry in the array IN is used as an index into the array STAT and the value at that index is incremented. When line 1170 is executed, the individual entries of the array STAT contain the number of times that each possible data value between 0 and 255 occurs in the array IN. The total number of valid values in the array IN is stored in a variable TOTAL_COUNT.

Parameters which describe the particular variable length code to be used to encode the data in the array IN are developed from the values in the array STAT using the algorithm set forth in the statements at lines 1210 to 1380 of the program in FIG. 6A.

To understand the algorithm implemented by these statements it is helpful to first describe the type of variable length code that is used by this system. This type of code may be described as having a number of levels. Each level is defined by a prefix, a sequence of binary values which occurs at the start of every code word in the blevel, and by a population, a number of code values having a common prefix. For the type of variable length code used in this embodiment of the invention, each of the prefixes except the first one includes a sequence of consecutive binary 1 values and every prefix except the final one ends with a binary 0 value. Thus, the prefixes for a 5 level variable length code are defined, for example, by the table 1.

TABLE 1

| Level | Code Prefix |
|---|---|
| 0 | 0 |
| 1 | 10 |
| 2 | 110 |
| 3 | 1110 |
| 4 | 11110 |
| 5 | 11111 |

The population of each level of the statistical codes, used in the embodiment of the invention is always an integral power of two. The population values for the different levels depend on the statistical distribution of the data. As implemented in the present embodiment a level may contain code values representing between 1 and 128 different code values. The individual members of a population of a given level are represented as an N-bit unsigned binary number, where the population at that level is $2^N$. An individual code value is generated by concatenating its index in the population of a level to the prefix for this level. For example the code described by the level and population parameters of table 2 is shown in table 3.

TABLE 2

| Level | Population |
|---|---|
| 0 | 4 |
| 1 | 2 |
| 2 | 8 |

TABLE 3

| LEVEL | VALUE | PREFIX | POPULATION INDEX | CODE |
|---|---|---|---|---|
| 0 | 0 | 0 | 00 | 000 |
|   | 1 |   | 01 | 001 |
|   | 2 |   | 10 | 010 |
|   | 3 |   | 11 | 011 |
| 1 | 4 | 10 | 0 | 100 |
|   | 5 |   | 1 | 101 |
| 2 | 6 | 11 | 000 | 11000 |

TABLE 3-continued

| LEVEL | VALUE | PREFIX | POPULATION INDEX | CODE |
|---|---|---|---|---|
| | 7 | | 001 | 11001 |
| | 8 | | 010 | 11010 |
| | 9 | | 011 | 11011 |
| | 10 | | 100 | 11100 |
| | 11 | | 101 | 11101 |
| | 12 | | 110 | 11110 |
| | 13 | | 111 | 11111 |

The type of code developed by the statistical encoder 40 is, in general terms, more efficient than the code used by above-referenced U.S. Pat. No. 4,125,861, which uses a different length code sequence for each possible data value, but less efficient than an optimal code such as a Huffman code. If the data applied to the statistical encoder 40 exhibits a negative-exponential distribution, the efficiency of the generated code is substantially the same as an optimal code. This generated code has the same population at each level and has a sufficient number of levels to represent all possible data values. While it has been determined that the data generated by the algorithms set forth above generally conforms to a negative exponential distribution, the best that may be said for the data that describes an individual image i that it follows a roughly monotonically decreasing statistical distribution. The code generated by the statistical encoder 40 encodes data of the type with relatively good efficiency because it essentially models the actual data distribution by a piecewise exponential distribution; the population of different levels may be different although, in the present embodiment of the invention, it is an integer power of two. For a Huffman code, the population at the different levels need not be an integer power of two.

In view of the description of the code set forth above, the algorithm which selects parameters to generate a particular code is described below. At line 1210, a variable I which is used as an index into the array STAT, and a variable LEVEL, which is used as an index into the array TABLE are set to zero. The IF statement at lines 1243-1246 assign the maximum value of seven to N if the probability of a given value is zero. This statement prevents the evaluation of the expression LOG2(0) which would produce an invalid result. The statement at line 1240 calculates the probability of the Ith entry of the array STAT and stores this probability value into the real variable PROB. The probability of the value I is equal to the number of data values having the value I (i.e, STAT [I]) divided by the total number of data values (i.e., TOTAL-COUNT). At line 1250, the integer part of the expression -LOG2(PROB) is decremented by one and the result is assigned to the variable N. The statements at lines 1255 and 1263 assign a value of zero or seven to the variable N when the value produced the statement 1250 is negative or greater than seven, respectively.

The value assigned to the variable N is indicative of the statistical significance of the value I in the array IN. When the value I occurs a relatively large number of times in the array IN, the value of N is relatively small and when the value I occurs only a relatively small number of times, the value of N is relatively large. For example, if I is equal to zero, and twenty-five percent of the values in the array IN are zeros, the value of N for I equal to zero is one. If, however, the value zero represents only one percent of the values in the array IN, the value of N for I equal to zero is five.

In the present embodiment of the invention, the value N is used to determine the population of a level. The value N, as computed above, is an initial estimate of the logarithm base 2 of the number of entries at the current level; that is, the first approximation of the population of the current level is $2^N$. Since the value of the variable N is an integer, it may be desirable to increase N by one, that is to say, to round-up the expression at line 1250. To determine whether N should be incremented, the probabilities of all of the entries at the current level, based on a population of $2^N$, are summed and compared to a constant value of 0.3820. If the sum of these probabilities is less than the constant value, the value of N is increased by 1. This sequence of operations is represented by the statements at lines 1265 through 1316. The IF statement which spans lines 1320 to 1353 puts N, the parameter value for the current level, into the array TABLE. If twice the number of entires represented by the value N will complete the table (i.e. if $I+2^{(N+1)}>255$) then the current level is the last level; the number of entries in the current level is doubled and the variable I is set to 256 to terminate the loop. If the test at line 1320 fails, the ELSE clause (lines 1336 to 1353) is executed. This clause sets the population of the current level at $2^N$ and augments the value held in the variable I to point to the first entry after the entries included in the current level.

The IF statement from line 1320 to line 1353 differentiates between the last level or parameter value for the statistical code and any of the levels that proceed it. As set forth above in relation to table 3, the prefix for the last level of the code ends with a binary one, while the prefixes for the other code levels all end with a binary zero. Since the sequence of binary one values which identifies the last level is not followed by a binary zero, the last level may represent twice as many values for the same number of bits in a code word as any other level. This IF statement checks each level as it is calculated to determine if the level may be the last level. If so, a parameter value for the last level is calculated and assigned to the array TABLE and the WHILE loop is terminated without incrementing the variable LEVEL. Otherwise, the population value for an intermediate level is calculated and assigned as the parameter value for the level and the variable LEVEL is incremented so that the WHILE loop may calculate the population for the next level.

The statement at line 1370 decreases the value of TOTAL_COUNT by the sum of the values from the array STAT that are represented by the level that was just computed. This step conditions the WHILE loop, at statements 1220-1380, to calculate the population for the remaining levels without regard to the population of the previous levels.

The program statements in the WHILE loop continue to calculate the population values for the various levels of the statistical code until the variable I has a value greater than 256.

The inventors have determined that this algorithm produces a variable-length code which closely approximates the coding efficiency of an optimal code, such as a Huffman code when the data values conform to any negative exponential distribution and produces a relatively efficient code when the data values conform to any generally monotonically decreasing statistical distribution. As set forth above, the steps performed by the compressed signal processor 30 are designed to produce data having at least a generally monotonically decreasing statistical distribution.

As an alternative to the method presented above, the inventors have determined that parameters describing a satisfactory variable length code may be developed by accumulating probabilities of $2^N$ data values, for N increasing incrementally from zero, until the accumulated sum of probabilities is greater than 0.3820. The value of N which satisfies this test is the parameter value for the current level. This algorithm continues, eliminating the statistical data for the values at lower levels, until code values have been assigned to all possible data values.

The next step in the algorithm represented by the program in FIGS. 6A and 6B is to build a translation table for the statistical code. An exemplary algorithm for generating a translation table is shown in the program statements at lines 1410 through 1610.

The statement 1410 assigs a one-bit zero value to the binary string BASE. A FOR loop, which includes the statements from line 1450 through line 1550, builds a translation table for every level except the last. At line 1470, the value in the Ith table entry (i.e., the logarithm base 2 of the population of the Ith level) is assigned to the variable N. A nested FOR loop which spans the statements from line 1480 through line 1520 uses the value in the variable N to develop a binary string value for each member of the population at level I and enters the string values into successive locations in the array XLATE_TABLE. The string value developed for a particular member of a particular level is obtained by concatenating an N-bit binary value, representing the index of the member in the population at the level I, to the prefix value held in the variable BASE. The code value generated by this operation has the value held in the variable BASE in the more significant bit positions and the value representing the index in the less significant bit positions.

The statement 1530 changes the value assigned to the variable BASE by concatenating a one-bit binary one value to the value held by the variable BASE at the MSB position. This value is the prefix for the next level. It is used to develop the code words for the next level.

The program statements at lines 1555 to 1610 build the translation table entries for the last level of the code. The statement 1555 assigns a value to the variable BASE which is a string of LEVEL-1 binary one values. This corresponds to a value of $2^{LEVEL}-1$. A FOR loop which spans the lines 1570 to 1610 forms the code words for the last level by concatenating N-bit binary values, representing the index of each entry of the population of the last level, to the prefix value held in the string variable BASE.

The final part of the program for the statistical encoder 40 translates the data in the array IN using the statistical code which has been developed by the other parts of the program. The statement at line 1650, assigns a value of zero to the variable I which is used as an index into the array IN. The binary string variable DATA_OUT is assigned a null value by the statements at line 1660. The statements at lines 1670 through 1710 append the 16 eight-bit entries of the array TABLE to the string variable DATA_OUT. These values are parameters which are used by the statistical decoder 50 to recover the fixed length data values from the code stream. The parameter values from the array TABLE are stored in the array as values of two raised to the power of the paramter value (i.e. as a population for the corresponding level). These values are converted into binary-string form using a function RBSTRING which reverses the order of significance of the bits, putting the LSB of the value into the string DATA_OUT first and putting the MSB of the value into the string last. This reversal of the bit-order of the parameter values is desirable because of the manner in which the parameter values are recovered from the binary string by the statistical decoder 50, described below. The WHILE loop at lines 1720 through 1743 translates the fixed length data values in the array IN into their corresponding variable length code words and appends each code word, the MSB of the code word first to the string variable DATA_OUT.

The last statement in the program, 1770, sends the encoded data through the transmission channel 45 to the statistical decoder 50. As set forth above, the transmission channel may be a conductor for conveying a bit-serial digital signal if the statistical encoding is used to enhance the efficiency of data transmission, or it may be a bus for conveying a multiple-bit signal to a memory if the statistical encoder 40 is used to compress the data for more efficient storage. In the embodiment of the invention shown in FIG. 1, the transmission channel 45 between the statistical encoder 40 and the statistical decoder 50 is a bit-serial data path.

FIG. 7 is a block diagram showing circuitry suitable for use as the statistical decoder 50. The circuitry shown in FIG. 7 divides the data provided to it into eight-bit bytes for storage and processing via eight-bit data paths. It is contemplated that equivalent circuitry may be designed which uses 16, 32 or 64 bit data paths as a straightforward extension of the circuitry that is shown. In general, the circuitry shown in FIG. 7 includes a buffer memory 716 for storing data as it is received from the transmission channel 45, and for providing the data to the decoding circuitry as it is requested. The decoding circuitry includes a random access memory (RAM) 724 which holds the table of parameters that describe the code developed by the encoding circuitry 40. The data in the buffer memory 716 is decoded by combining, in an adder 738, parameter values from the RAM 724 and values extracted from the data provided by the memory 716. The circuitry which performs the decoding operation is controlled by control circuitry 720.

The bit-serial signal DATA provided via the transmission channel 45 is applied to a shift register 710 and to write address generating circuitry 712. The signal DATA may be, for example, a non-return to zero (NRZ) signal in which the clock signal needed to recover the data is encoded with the data. The circuitry 712 used in this embodiment of the invention includes a phase locked loop (PLL) (not shown) which is responsive to the signal DATA to regenerate this clock signal and to provide it, as a signal DCK, to the shift register 710.

The shift register 710 used in this embodiment of the invention is an eight-bit, serial-in parallel-out register. In steady state operation, that is, when the signal DCK has stabilized, the write address generating circuitry 712 conditions the shift register 710 to accept the bit-values of the signal DATA as they are provided via the transmission channel 45. The write address generator 712 further conditions a register 714, via a signal WLD, to load the value held in the shift register 710 each time that eight bits of data have been shifted into the register 710.

The eight-bit values held in the register 714 are applied to a data input port of the buffer memory 716. The write address generator 712 generates a write address value, WADR, and pulses the buffer memory write enable signal, BWE, to store the value held by the register 714 into the buffer memory 716. The write address value, WADR, may be generated by a counter (not shown) internal to the circuitry 712.

The signal BWE is also applied, by the write address generator 712, to the control circuitry 720 to indicate that a data write operation is in progress. The control circuitry 720 monitors this signal to schedule data read operations at times that do not interfere with the data write operations. The control circuitry 720 initiates a data read operation by pulsing a signal RREQ which is applied to read address generation circuitry 718. This signal conditions the circuitry 718 to increment an internal counter (not shown) which provides a read address value, RADR, to the buffer memory 716. Responsive to this read address value, the buffer memory 716 applies an eight-bit data value to a parallel-input, parallel-output register 722.

While the buffer memory 716 is shown as having separate data input and data output busses and separate read and write address busses, it is contemplated that a memory having a single data bus and single address bus may be used. If such a memory were used, the output ports of the read address generator 718 and write address generator 712 and the output port of the register 714 would desirably be gated to the respective address and data busses of the memory via three-state devices. The register 714 and circuitry 712 used with this memory would be controlled by the signal BWE to apply data or address values to the respective busses when a write operation is in progress and to present a high impedance to the busses otherwise. In the same manner, the circuitry 718 would be controlled by the signal RREQ to provide an address value to the bus when a read operation is in progress and to provide a high impedance otherwise.

Data values provided by the buffer memory 716 to the register 722 are loaded synchronous with the negative-going edge of a signal ORL which is applied to the register 722 by the control circuitry 720. Data values held in the resister 722 are applied to a random access memory (RAM) 724 and to a parallel-input, serial-output register 732.

The RAM 724 used in this embodiment of the invention holds the parameters which define the statistical code developed by the statistical encoder 40 as set forth above. These parameters values are imbedded in the data stream passed through the channel 45. They are used by the decoder 50 to recover the encoded data as described below. When a parameter value is applied to the register 722 from the buffer memory 716, the control circuitry 720 pulses a signal WE to condition the RAM 724 to store the parameter value into a memory cell addressed by an address value provided by a counter 726. When the parameter value has been written into the RAM 724, the control circuitry 720 pulses the signal CCK to condition the counter 726 to increment its value.

These parameter values may be read from the RAM 724 and applied to a pair of registers 728 and 730. The register 728 is a one-bit register which is configured to receive the MSB of a parameter value provided by the RAM 724. The value held in this one-bit register is applied to the control circuitry 720 as a signal END.

The register 730 is a seven-bit parallel-input, parallel or serial output register which is configured to receive the seven LSB's of the parameter value provided by the RAM 724. A new parameter value is loaded into the registers 728 and 730 responsive to a signal MSLD provided by the control circuitry 720. The data value held in the register 730 is shifted toward less significant bit position responsive to a signal MSH provided by the control circuitry 720. The serial output signal provided by the shift register 730 is a signal LB which is applied to the control circuitry 720.

The bit-shifting capability of the register 730 is used extract the the population-index portion of a code word from the data stream. When this value is extracted, the parameter value held in the register 730, which is an integer power of two, is shifted toward successively less significant bit position until the binary one of the parameter value occupies the LSB position of the register. That is, until the signal LB has a value of one. As this value is shifted, the population index value is shifted in lock-step into a pair of registers 734 and 735 as set forth below. When the signal LB has a value of one, the shifting operation is complete and the population index value is held by the registers 734 and 735.

The seven-bit parallel output value provided by the register 730 is applied to one input port of a multiplexer 736. A zero-valued one-bit signal provided by a source 731 is concatenated at the MSB position to this seven-bit value at the one input port of the multiplexer 736 to form an eight-bit value. A second input port of the multiplexer 736 is provided with a data value from the registers 734 and 735. These data values are developed from the statistically encoded data provided by the buffer memory 716, as described below.

As eight-bit values representing statistically encoded data are required by the decoding processor 50, they are provided by the buffer memory 716. These values are loaded into the parallel-input, parallel-output register 722 responsive to the signal ORL provided by the control circuitry 720. The eight-bit values held in the register 722 are transferred to the parallel-input serial-output register 732 responsive to a control signal OSRL provided by the control circuitry 720. Data values held in the register 732 are shifted toward less significant bit positions responsive to a signal OSH provided by the control circuitry 720.

As the last bit of an eight-bit data value is shifted out of the register 732, a new eight-bit data value is loaded into the register 732 from the register 722 responsive to the control signal OSRL provided by the control circuitry 720. The circuitry 720 controls the read address generator 718, and the register 722 to load a new eight-bit value from the memory 716 immediately after a value is transferred from the register 722 to the register 732. Accordingly, the register 732 may provide a continuous stream of bit values synchronous with the signal OSH.

The signal OSH is also coupled to a one-bit register 735 which is, in turn coupled to a serial-in parallel-out register 734. The register 735 receives the bit-serial output signal from the register 732. This bit-serial signal is applied to the LSB position of the register 734 from the output terminal of the register 735 and is shifted toward more significant bit positions of the register 734 responsive to the signal OSH. The one-bit value held in the register 735 is applied to the control circuitry 720 as the signal BT. The eight-bit value held in the registers 734 and 735 is applied to the second input port of the multiplexer 736 as set forth above. In addition to the above, the register 734 is responsive to a reset signal RST provided by the control circuitry 720 to set each of the seven bits of the value held by the register to zero. When a population index value is required by the decoding algorithm, the register 734 is reset and N−1 bit values are shifted from the register 732 to the register pair 734 and 735. These bit values are shifted in lock-step with the signal MSH which conditions the register 730 to act as a counter, counting from 1 to N−1. In this instance, N is the logarithm base 2 of the population of the level represented by the parameter value held in the register 730, that is, the bit position of the binary-one in the parameter value.

The multiplexer 736 is controlled by a signal MXC provided by the control circuitry 720 to provide either the seven-bit value held by the register 730, with the zero-valued MSB provided by the source 731, or the eight-bit value held by the registers 734 and 735 to one input port of an adder 738. The output port of the adder 738 is coupled to the input port of an eight-bit parallel-input, parallel-output register 740, the output port of which is coupled to a second input port of the adder 738. The combination of the adder 738 and register 740 form an accumulator. The value held by the accumulator register 740 changes when the signal ALD, provided by the control circuitry 720 is pulsed. This signal conditions the register 740 to load the output value provided by the adder 738. The register 740 may be reset to have a zero value by a signal AR, provided by the control circuitry 720.

The output signal provided by the adder 738 is also applied to an eight-bit parallel-input, parallel-output register 742 which is the output register of the statistical decoder 50. A new data value is loaded into the register 742 responsive to an output load signal, OLD, provided by the control circuitry 720. The signal OLD is an output signal of the decoder 50; it is applied to the video signal processor 60, as shown in FIG. 1, to indicate to the processor 60 that a decoded data value is available from the decoder 50.

Briefly, the decoding operation proceeds as follows. When a new code stream is provided by the encoder 40, the digital bit-stream provided via the transmission channel 45 is divided into a series of eight-bit values which are stored, as they are received, into the buffer memory 716. The first 16 eight-bit values in the bit stream are the 16 parameter values which describe the code. As set forth above, the parameter values are bit-reversed relative to the code words in the bit stream, thus the MSB of a parameter value loaded into register 710 is in the MSB position of the register. The remaining bits in the bit stream are variable-length code words. As set forth above, the bits of each code word in the bit stream are arranged so that the more significant bits occur in the bit-stream before the less significant bits. The eight-bit values are stored in memory cells having incrementally increasing address values. The stored values thus represent a bit stream which starts at the LSB position of the first eight bit-value after the 16 parameter values and continues through memory cells having incrementally increasing address values in the buffer memory 716.

The first step in the decoding process is to load the 16 parameter values which occur at the head of the bit-stream into the RAM 724. The first parameter is loaded at address zero, the second at address one, and so on up to address 15. The counter, 726 which generates the address values for the RAM 724, is then reset to zero so that the parameter values may be used in sequence to decode the encoded data.

Once the parameter values have been loaded, the data decoding may begin. Eight-bit values representing encoded data are read from the buffer memory 716 in sequence and are loaded into the shift register 732. At the beginning of a code word, each binary-one value provided by the shift register 732 conditions the decoding circuitry to add the current parameter value from the register 730 to the accumulated value held in the register 740. The next successive parameter value is then loaded into the register 730 as the new current parameter. When the first zero is encountered in the bit stream provided by the shift register 732 or when a parameter having a binary one in its END bit is encountered, the number of bits indicated by the current parameter value are shifted into the registers 734 and 735, using the register 730 as a bit-shift counter, and the decoding circuitry is conditioned to add the value that has been shifted into the registers 734 and 735 to the accumulated value to produce a decoded data value. The counter 726, register 740 and shift register 734 are then reset to prepare to decode the next encoded data value. After adding the value in register 734 to the value in register 740, the control circuitry 720 pulses the signal OLD to load the decoded value into the register 742.

The operation of the statistical decoder 50 is explained with reference to the timing diagram shown in FIG. 8 which spans 23 periods of the input data clock signal, DCK, time intervals $T_0$ through $T_{22}$. To simplify the explanation of the circuitry shown in FIG. 7 it is assumed that all of the circuitry shown in FIG. 7 operates in synchronism with the signal DCK. It is contemplated, however, that the circuitry which reads the encoded data from the buffer memory 716 and the circuitry which performs the decoding operations may use a separate, asynchronous clock signal. The code described in TABLE 3 is assumed in the following description.

Figure 8:
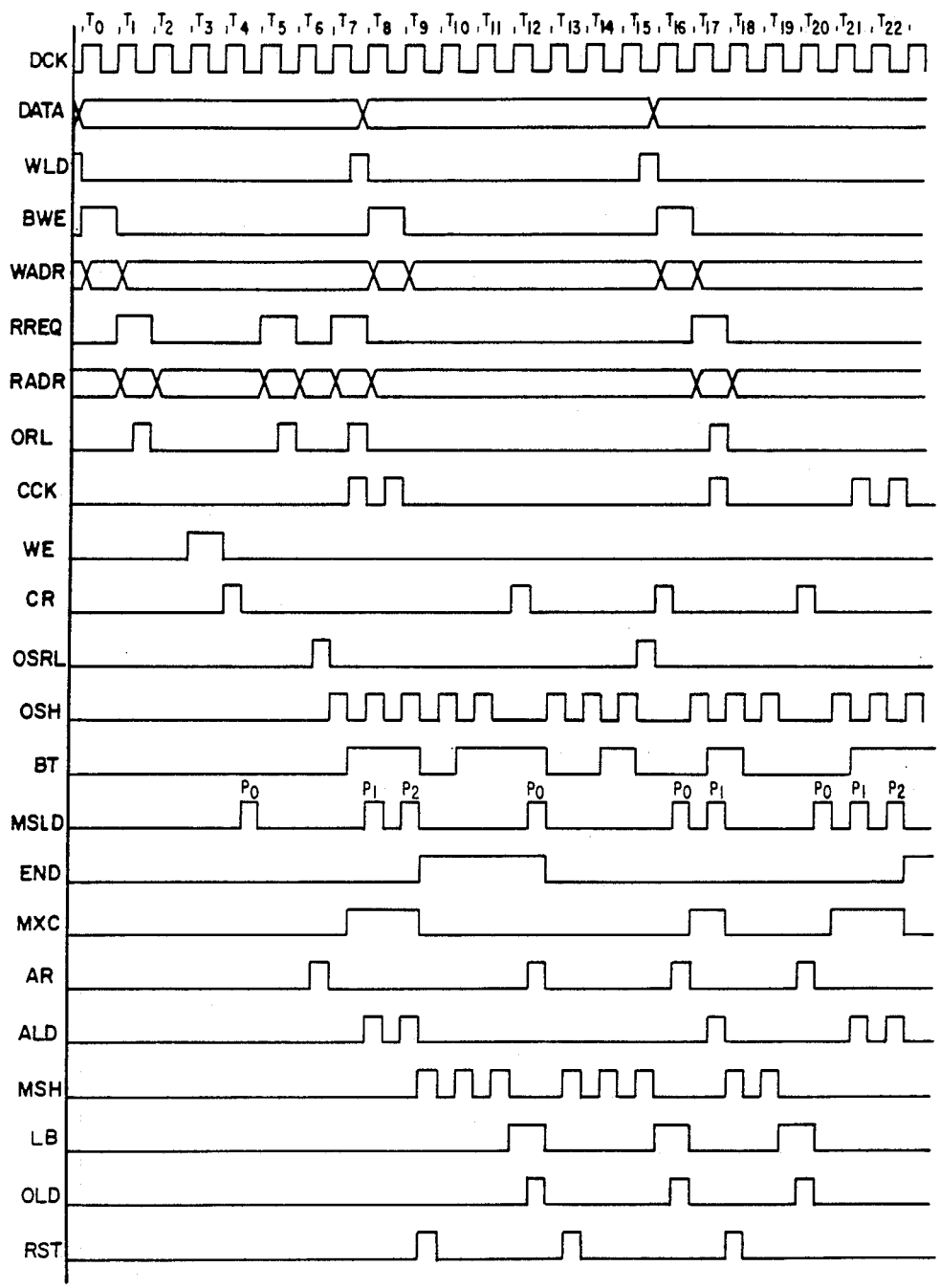
FIG. 8 is a timing diagram that is useful for explaining the operation of the statistical decoder circuitry shown in FIG. 7.

In the total time period shown in FIG. 8, 23 bits of encoded data are provided by the statistical encoder 40 as the signal DATA. These bits are shifted into the register 710 synchronous with 23 successive negative-going transitions of the signal DCK. Sixteen of these data bits are transferred, eight-bits at a time, to the register 714 synchronous with negative-going transitions of the signal WLD occurring at the end of the time intervals T7 and T15. These data values are written into the buffer memory 716 during the time intervals $T_8$ and $T_{16}$, respectively, as indicated by the signals BWE and WADR.

The remainder of the signals in FIG. 8 illustrate the operation of the statistical decoder 50 as it loads the last parameter value for a code into the RAM 724 and then decodes the bit-stream 11011010100 to obtain the three eight-bit binary values 00001001, 00000010, and 00000100 (i.e., 9, 2 and 4).

Although 16 parameter values are transmitted with the encoded data, only three parameter values are relevant in the present example, these parameter values are $P_0=00000100$, $P_1=00000010$ and $P_3=10001000$.

During the time interval $T_1$, the control circuitry 720 pulses the signal RREQ to request that an eight-bit data value be read from the buffer memory 716. In response to the signal RREQ, the read address generator 718 applies a read address value, RADR, to the buffer memory 716 during the time interval $T_1$. At the end of the time interval $T_1$, the read address generator 718 increments its internal read address value to prepare for the next read operation. The value provided by the buffer memory 716 in response to the applied read address value is stored into the register 722 coincident with a negative-going transition of the signal ORL provided by the control circuit 720, occurring at the end of the time interval $T_1$.

In the exemplary timing diagram shown in FIGURE 8, the data value read from the buffer memory 716 at time $T_1$ is the last (16th) parameter value describing the code which was used by the statistical encoder 40 to generate the signal DATA. During the time interval $T_3$, the counter 726, which had been incremented prior to time $T_0$, provides the address of the last parameter value in the RAM 724 (I.E. 15) to the address input port, AD of the RAM 724. Also during the time interval $T_3$, the control circuitry 720 pulses the signal WE to condition the RAM 724 to store the parameter value into the addressed memory location.

After storing the last parameter value into the RAM 724, the control circuitry 720 pulses the signal CR during time interval $T_4$ to reset the value held by the counter 726 to zero. To prepare for the first bit of encoded data, the control circuitry 720 pulses the signal MSLD to load the first paramater value, $P_0$, into the register pair 728 and 730 during the second half of the time interval $T_4$.

During time interval $T_5$, the control circuitry 720 pulses the signal RREQ to request that the next successive eight-bit value be read from the buffer memory 716. This value is loaded into the register 722 at the end of the time interval $T_5$, synchronous with the negative going transition of the signal ORL. The eight-bit value held in the register 722 is transferred to the register 732 synchronous with the negative-going transition of the signal OSRL occurring at the end of the time interval $T_6$.

During the time interval $T_6$, the control circuitry 720 pulses the signal AR to reset all of the bits in the register 740, initializing the accumulator.

During the time interval $T_7$, the control circuitry 720 initiates a memory read operation from the buffer memory 716 and stores the value read into the register 722. Also during the time interval $T_7$, the control circuitry 720 pulses the signal OSH to transfer the bit value in the LSB position of the register 732 (i.e. The MSB of the first code word) to the register 735. This bit value is transferred synchronous with the negative going transition of the signal OSH occurring at the midpoint of the time interval $T_7$. In the exemplary timing diagram shown in FIG. 8, this bit value is a binary one. Accordingly, at the midpoint of the time interval $T_7$, the signal BT, which represents the value held by the register 735, has a value of one.

Responsive to the signal BT having a value of one, the control circuitry 720 changes the value of the signal MXC to a binary one, conditioning the multiplexer 736 to apply the current parameter value from the register 730, with a binary zero from the source 731 in its MSB position, to the adder 738. The adder 738 sums this value with the zero value held by the register 740. The sum of these two values is stored into the register 740 synchronous with a negative going transition of the signal ALD occurring at the midpoint of the time interval $T_8$.

The signal CCK is pulsed during the time interval $T_7$ to increment the value held in the counter 726 so that the second parameter value, $P_1$, is available at the output port of the RAM 724. During the time interval $T_8$, the control circuitry 720 pulses the signal MSLD to load the second parameter value into the registers 728 and 730. In addition, the circuitry 720 pulses the signal OSH to condition the shift register 732 to provide the next successive bit of the code word to the shift register 735. In the present example, this bit value is a binary one.

Responsive to the one-valued signal BT, the control circuitry 720 conditions the multiplexer 736 adder 38 and register 740 to add the second parameter value, $P_1$, held by the register 730, to the value already held in the register 740. This result is stored in the register 740 synchronous with a negative-going transition of the signal ALD occurring at the midpoint of the time interval $T_9$.

During the time interval $T_8$, the control circuitry 720 pulses the signal CCK to increment the counter 726, preparing the RAM 724 to provide the third parameter, $P_2$, at its output port.

In the time interval $T_9$, the third parameter is loaded into the register 730 and the next bit of encoded data is provided by the shift register 732 to the register 735. In this example, the END bit of the third parameter value, held in the one-bit register 728, is a binary-one. Responsive to the binary-one valued signal END, provided by the register 728, the control circuitry 720 changes the signal MXC to a logic zero, conditioning the multiplexer 736 to apply the value held by the registers 734 and 735 to the adder 738. The value of binary-one for the signal END also conditions the control circuitry 720 to pulse the signal RST, setting the seven bits of the shift register 734 to zero.

During the latter half of the time interval $T_9$, the control circuitry 720 pulses the signal MSH to shift the seven LSB's of the third parameter value, held by the register 730, one bit position toward lesser significance. In this mode, the register 730 is used as a counter to count the number of bits to be shifted from the shift register 732 to the pair of registers 735 and 734. In the present example, the control circuitry 720 emits pulses of the signals MSH and OSH in lock-step during the time intervals $T_9$, $T_{10}$, and $T_{11}$, until, at the start of the time interval $T_{12}$, a binary one is shifted into the LSB position of the register 730. When this occurs, the signal LB provided by the register 730 has a value of one, conditioning the control circuitry 720 to hold the signals OSH and MSH at binary-zero values. At the start of the time interval $T_{12}$, the register pair 734 and 735 holds the population index of the first variable length code word (i.e. 00000011)

Since the multiplexer 736 is conditioned to apply the eight-bit value in the register pair 734 and 735 to the adder 738, the output value of the adder is the sum of that value and the value held by the register 740. This sum is a decoded data value. It is loaded into the output register 742 by the signal OLD which is pulsed by the control circuitry 720 during the latter half of the time interval $T_{12}$.

As the control circuitry 720 conditions the output register 742 to load the output data value, it pulses the signal AR to set the contents of the register 740 to zero.

During the time interval $T_{13}$, the first bit of the next successive code word, a binary-zero, is shifted into the register 735. A binary-zero for the signal BT provided by the register 735 has the same effect as a value of binary-one for the signal END. During the time intervals $T_{14}$ and $T_{15}$, the control circuitry 720 simultaneously shifts bits from the bit stream into more significant bit positions of the registers 734 and 735 and bits of the parameter zero, held in the register 730, into less significant bit positions until, during the time interval $T_{16}$, the signal LB has a binary-one value. When this occurs, the value in the register pair 734 and 735 is applied to the adder 738, summed with the zero value held in the register 740 and then stored into the output register 742 coincident with the negative-going transition of the signal OLD occurring at the end of the time interval $T_{16}$.

The circuitry shown in FIG. 7 operates in the manner described above for the remainder of the time intervals $T_{17}$ through $T_{22}$. The values provided by the decoder at the end of the time intervals $T_{12}$ and $T_{16}$ are 9 and 2, respectively. The timing diagram of FIG. 8 further relates to the decoding of encoded binary value 100 to obtain the data value 4 at the end of the time interval $T_{19}$.

The data values provided by the statistical decoder 50 are applied to a video signal processor 60 which may store the data values in a field or frame store memory (not shown) and then process the stored data for display on a display device 70.

In the embodiment of the invention set forth above, it is assumed that the video signal processor 60 operates with sufficient speed to process the pixel values as they are provided by the decoder 50. In a system which uses a slower video signal processor, it may be desirable to include circuitry (not shown) in the decoder which would suspend the operation of the decoder when the processor 60 is not ready to accept the data provided by the decoder. This circuitry may be included in the control circuitry 720 and may be responsive to a WAIT signal (not shown) provided by the processor 60 to inhibit the generation of the signals OSH, MSH, OSRL and MSLD.

What is claimed is:

1. A system for decoding statistically encoded digital data, comprising:
   a source of said statistically encoded digital data including a plurality of parameter values each of which describes a set of code words representing respective fixed-length data values;
   memory means, coupled to said source for holding said plurality of parameter values; and
   decoding means, coupled to said source and to said memory means for arithmetically combining selected ones of said plurality of parameter values with data values extracted from said encoded digital data to generate fixed-length decoded data values.

2. The system set forth in claim 1, wherein said decoding means includes:
   digital value accumulating means responsive to a first control signal for accruing a sum of digital values applied thereto to generate said fixed-length decoded data values;
   data multiplexing means coupled to said memory means and to said source and responsive to a second control signal for selectively providing one of said parameter values provided by said memory means or one of said data values extracted from the encoded digital data provided by said source, to said digital value accumulating means; and
   control means, responsive to successive bit values of the encoded data provided by said source for generating said first and second control signals.

3. The system set forth in claim 2 wherein said decoding means further includes:
   a shift register, coupled to said source and responsive to a third control signal for shifting successive bit values of the encoded data provided by said source into progressively more significant bit positions to extract said data values from said encoded data for application to said data multiplexing means;
   wherein said control means includes means responsive to a predetermined bit value of said encoded digital data and to a selected one of said plurality of parameter values for generating said third control signal.

4. A system for decoding statistically encoded digital data, comprising:
   a source of said statistically encoded digital data including a plurality of parameter values each of which describes a set of codewords representing respective fixed length data values;
   buffer means, coupled to said source for storing the encoded digital data provided thereby and responsive to a data read control signal for providing said stored data as a bit-serial signal;
   memory means, coupled to said buffer means, and responsive to a parameter write control signal for storing said plurality of parameter values provided by said buffer means, said memory means being further responsive to a parameter read control signal for providing said stored parameter values at an output part;
   decoding means, coupled to said buffer means and to said memory means and responsive to a decoding control signal for summing selected ones of said plurality of parameter values with a plural-bit data value extracted from the bit-serial signal provided by said buffer means to generate a fixed-length decoded data value;
   control means, coupled to said buffer means for generating said data read control signal and responsive to the bit-serial signal provided by said buffer means for generating said parameter write control signal, said parameter read control signal and said decoding control signal.

5. The system set forth in claim 4 wherein:
   said decoding control signal includes first, second and third control signals; and said decoding means includes:
      data value extracting means including a shift register, coupled to said buffer means and responsive to said third control signal for shifting successive bit values of the bit-serial encoded data signal provided by said buffer means into progressively more significant bit positions of the shift register to develop said plural-bit data value from said bit-serial encoded data signal;
      data multiplexing means, coupled to said memory means and to said data value extracting means and responsive to said second control signal for selectively providing one of the parameter values provided by said memory means or said plural-bit data value at an output part;
      digital value accumulating means, responsive to said first control signal for accruing a sum of digital values provided by said data multiplexing means to generate said fixed-length decoded data value.

6. The system set forth in claim 4 wherein said control means is responsive to one of said parameter values provided by said memory means and to said bit-serial encoded data signal for generating said third control signal.

* * * * *